United States Patent [19]
Jeong et al.

[11] Patent Number: 5,811,875
[45] Date of Patent: Sep. 22, 1998

[54] LEAD FRAMES INCLUDING EXTENDED TIE-BARS, AND SEMICONDUCTOR CHIP PACKAGES USING SAME

[75] Inventors: Do Soo Jeong; Hai Jeong Sohn; Hyeon Jo Jeong, all of Kyungki-do, Rep. of Korea

[73] Assignee: Samsung Electronics Co., Ltd., Suwon, Rep. of Korea

[21] Appl. No.: 673,278

[22] Filed: Jun. 28, 1996

[30] Foreign Application Priority Data

Jun. 29, 1995 [JP] Japan ................................. 1996-22327
Jun. 19, 1996 [JP] Japan ................................. 1995-18132

[51] Int. Cl.⁶ .......................... H01L 23/28; H01L 29/44; H01L 23/48; H01L 23/50
[52] U.S. Cl. .......................... 257/672; 257/666; 257/668; 257/676; 257/692; 257/696
[58] Field of Search ..................................... 257/690, 666, 257/676, 787, 692, 669, 670, 668, 667, 672–674; 174/52.4; 29/827

[56] References Cited

U.S. PATENT DOCUMENTS

| | | |
|---|---|---|
| 4,862,245 | 8/1989 | Pashby et al. ........................... 257/660 |
| 5,198,883 | 3/1993 | Takahashi et al. ....................... 257/676 |
| 5,227,661 | 7/1993 | Heinen ..................................... 257/671 |
| 5,304,842 | 4/1994 | Farnworth et al. ..................... 257/666 |
| 5,334,873 | 8/1994 | Cha .......................................... 257/666 |
| 5,357,139 | 10/1994 | Yaguchi et al. ......................... 257/675 |
| 5,545,921 | 8/1996 | Conru et al. ............................. 257/674 |
| 5,637,915 | 6/1997 | Sato et al. ................................ 257/666 |
| 5,648,682 | 7/1997 | Nakazawa et al. ..................... 257/673 |
| 5,684,328 | 11/1997 | Jin et al. .................................. 257/669 |

*Primary Examiner*—Tom Thomas
*Assistant Examiner*—Alexander Oscar Williams
*Attorney, Agent, or Firm*—Myers Bigel Sibley & Sajovec

[57] ABSTRACT

Lead frames for semiconductor chips include spaced apart tie-bars which extend to contact and support the semiconductor chip. Adhesive is used between the tie-bars and the chip to adhesively couple the tie-bars to the chip. The lead frame leads therefore need not be used to adhesively couple the chip to the lead frame, thereby reducing or eliminating the need for equal spacing and close coupling of the leads, and reducing or preventing problems caused by deterioration of adhesive on the leads. The tie-bars may include polyimide tape or liquid adhesive held in cups. During fabrication, a semiconductor chip is mounted on the adhesive material, such that the tie-bars mechanically support the semiconductor chip and the lead ends extend adjacent the semiconductor chip. The lead ends are then electrically connected to the semiconductor chip and the package is encapsulated.

13 Claims, 7 Drawing Sheets

LEAD FRAMES INCLUDING EXTENDED TIE-BARS, AND SEMICONDUCTOR CHIP PACKAGES USING SAME

FIELD OF THE INVENTION

This invention relates to microelectronic devices and fabrication methods, and more particularly to semiconductor chip packages and fabrication methods.

BACKGROUND OF THE INVENTION

Semiconductor chip packages are widely used in commercial, industrial, military and other electronics applications. As is well known to those having skill in the art, a semiconductor chip package may include at least one semiconductor chip and a lead frame. The lead frame includes a plurality of leads which electrically connect to pads on the semiconductor chip which extend external to the chip encapsulation to allow the chip to be mounted on a mounting substrate such as a printed circuit board. As is also known to those having skill in the art, the plastic packages in which the at least one semiconductor chip is encapsulated by an epoxy compound may limit the mounting density of the chip, because space must generally be provided to secure the interconnect leads to the corresponding bonding pads on the chip. The chip usually occupies up to seventy percent of the total size of the package.

To increase mounting density, LOC (Lead on Chip) or COL (Chip on Lead) packages have been proposed. In particular, LOC type packages may allow mounting of a relatively large chip, forming of bus bars supplying power to chip, and may improve the electrical characteristics of the package. Further, for LOC type packages, the chip bonding pads can be formed on the center or edges of a surface of the chip, thus allowing design flexibility. Moreover, the padless structure may prevent delamination between the die pad and the encapsulant molding compound due to differences between their thermal expansion coefficients.

FIG. 1 is a plan view of a conventional lead frame. With reference to FIG. 1, lead frame (50) includes leads (20), and tie-bars (40) disposed at the opposing end sides. Leads (20) are divided into inner leads (22) which are electrically connected to respective bonding pads on the chip, and outer leads (24) which are exposed outside the package body after encapsulation, and which are integrated with the inner leads (22). Outer leads (24) and tie-bars (40) are integrated with side rail (45) of lead frame (50). Side rail (45) supports leads (20) and tie-bars (40), and contacts a transfer rail (not shown) when lead frame (50) moves. Inner leads (22) are mechanically connected to a chip (not shown in FIG. 1) with a double sided adhesive polyimide tape (30). Tape (30) is commonly attached to a plurality, for example seven in FIG. 1, of inner leads (22) disposed at the same position.

FIG. 2 is a cut-away perspective view of a semiconductor chip package employing the lead frame shown in FIG. 1. FIG. 3 and FIG. 4 are cross-sectional views taken along lines "3—3" and "4—4" in FIG. 2, respectively. With reference to FIGS. 2 through 4, LOC type package (100) includes a chip (10) which is attached to the bottom surface of inner leads (22) with double sided adhesive polyimide tapes (30). The tapes (30) are bonded to the areas of chip (10) where no bonding pad is formed. As described above, tapes (30) are commonly attached to bottom surfaces of a plurality of inner leads (22) which are attached to an upper surface of chip (10).

Bonding pads formed at the center of chip (10) are electrically connected to respective corresponding inner leads (22) through bonding wires (60). A molding resin encapsulant (80) protects chip (10), inner leads (22), bonding wires (60), and tie-bars (40) which are formed at opposite ends of the lead frame, from the external environment. The outer leads (24) extend from the package body, and are integrated with corresponding inner leads (22) as described in connection with FIG. 1. Outer leads (24) are adapted to mount on an electronic apparatus. LOC type packages (100) in FIGS. 2 through 4 are generally surface mount packages.

The above described package may have several disadvantages. Failures such as poor adhesion or formation of a void can occur when the pitch between each lead is not identical, since the tape bonded to the bottom surface of the inner leads is attached to an upper surface of the chip by thermocompression. Accordingly, the pitch between each inner lead should generally be carefully controlled to be identical to avoid this problem. Moreover, the fine pitch may induce coupling effects, resulting in decreased performance of the packages.

Polyimide tape is also absorptive. Accordingly, the larger the chip, the greater the area of the tape to be attached to chip, resulting in increased water absorption during reliability tests carried under high temperature, humidity and pressure, and during use by the consumer. Water absorption may cause delamination between the inner leads and tape, and between tape and chip, which may also degrade performance of the package.

SUMMARY OF THE INVENTION

It is therefore an object of the present invention to provide improved lead frames and semiconductor chip packages and fabrication methods therefor.

It is another object of the present invention to provide lead frames, semiconductor chip packages and fabrication methods which reduce delamination of tape which is used to bond the lead frame to the chip.

It is yet another object of the invention to provide lead frames, semiconductor chip packages and fabrication methods which do not require lead frame leads to be closely and equally spaced.

These and other objects are provided, according to the present invention, by providing lead frames which include spaced apart tie-bars which extend to contact and support a semiconductor chip. Adhesive is used between the tie-bars and the chip to adhesively couple the tie-bars to the chip. Thus, the leads need not be used to adhesively couple the chip to the lead frame, thereby reducing or eliminating the need for equal spacing and close coupling, and reducing or preventing problems caused by deterioration of the adhesive.

Lead frames for a semiconductor chip, according to the present invention, include a pair of spaced apart side rails. A plurality of leads extend from each of the spaced apart side rails toward the other of the spaced apart side rails. The leads include lead ends which extend adjacent a semiconductor chip placed adjacent thereto. A pair of spaced apart tie-bars each extend between the pair of spaced apart side rails to maintain the spaced apart side rails in spaced apart relation. Each of the spaced apart tie-bars further extend towards one another, sufficiently close to one another so as to overlie the semiconductor chip which is placed adjacent thereto. The spaced apart tie-bars include adhesive thereon so as to adhere to a semiconductor chip placed adjacent thereto. In contrast, the lead ends are preferably free of adhesive material thereon.

In other embodiments of lead frames, since the adhesive may take up space between the tie-bars and the chip, when the pair of spaced apart side walls and the pair of spaced apart tie-bars define a plane, the lead ends extend outside the plane to contact the chip. The tie-bars may contact the chip by providing a tie-bar extension on each of the spaced apart tie-bars, which extend toward one another so as to overlie a semiconductor chip placed adjacent thereto. The adhesive may be placed on the tie-bar extension. The adhesive may be a polyimide tape. Alternatively, the tie-bar ends may include at least one cup containing liquid adhesive material therein. A groove may be included in the tie-bar and adjacent the cup, for containing excess liquid adhesive from the cup.

Intermediate product semiconductor chip packages according to the invention include a semiconductor chip and a lead frame. The lead frame comprises a pair of spaced apart side rails, a plurality of leads extending from each of the spaced apart side rails, and a pair of spaced apart tie-bars which overlie the semiconductor chip and thereby mechanically support the semiconductor chip as already described above.

End product semiconductor chip packages according to the invention include a semiconductor chip and a plurality of leads extending away from the semiconductor chip, and which are electrically connected thereto. A pair of spaced apart tie-bars each extend away from the semiconductor chip and are electrically unconnected thereto, that is they are electrically insulated therefrom. An adhesive is located between each of the spaced apart tie-bars and the semiconductor chip so as to adhesively connect the semiconductor chip to the tie-bars. A package body encapsulates the semiconductor chip and partially encapsulates the leads, such that the leads extend from the package body. Preferably, the leads are free of adhesive material between the leads and the semiconductor chip. Also preferably, the spaced apart tie-bars are fully encapsulated by the package body. Also preferably, the spaced apart tie-bars extend from first and second opposite ends of the semiconductor chip, and the plurality of leads extend from third and fourth opposite ends of the semiconductor chip. The tie-bars may include cups, liquid adhesive and grooves as already described.

Semiconductor chip packages are fabricated, according to the invention, by providing a lead frame comprising a pair of spaced apart side rails; a plurality of leads extending from each of the spaced apart side rails towards the other of the spaced apart side rails, the leads including lead ends; and a pair of spaced apart tie-bars, each of which extends between the spaced apart side rails to maintain the spaced apart side rails in spaced apart relation and which further extend towards one another. Adhesive material is placed on the spaced apart side rails. A semiconductor chip is mounted on the adhesive material such that the tie-bars mechanically support the semiconductor chip and the lead ends extend adjacent the semiconductor chip. The lead ends are then electrically connected to the semiconductor chip.

Preferably, adhesive material is placed on the spaced apart side rails but not on the lead ends. Also preferably, the spaced apart side walls and spaced apart tie-bars define a plane and the lead ends extend outside the plane. The tie-bars therefore mechanically support the semiconductor chip, and the lead ends contact the semiconductor chip notwithstanding the presence of adhesive material between the semiconductor chip and the tie-bars.

In preferred embodiments of methods according to the invention, the spaced apart tie-bars each include a tie-bar extension each of which extends toward one another, and the placing step comprises the step of placing adhesive material on the tie-bar extensions, preferably at the ends thereof. Liquid adhesive may be placed in a cup at the tie-bar ends. After the leads are electrically connected, the semiconductor chip and at least part of the lead frame are encapsulated. The side rails and tie-bars may then be removed, with the tie-bar extensions remaining in the encapsulating material.

DETAILED DESCRIPTION OF PREFERRED EMBODIMENTS

Figure 1:
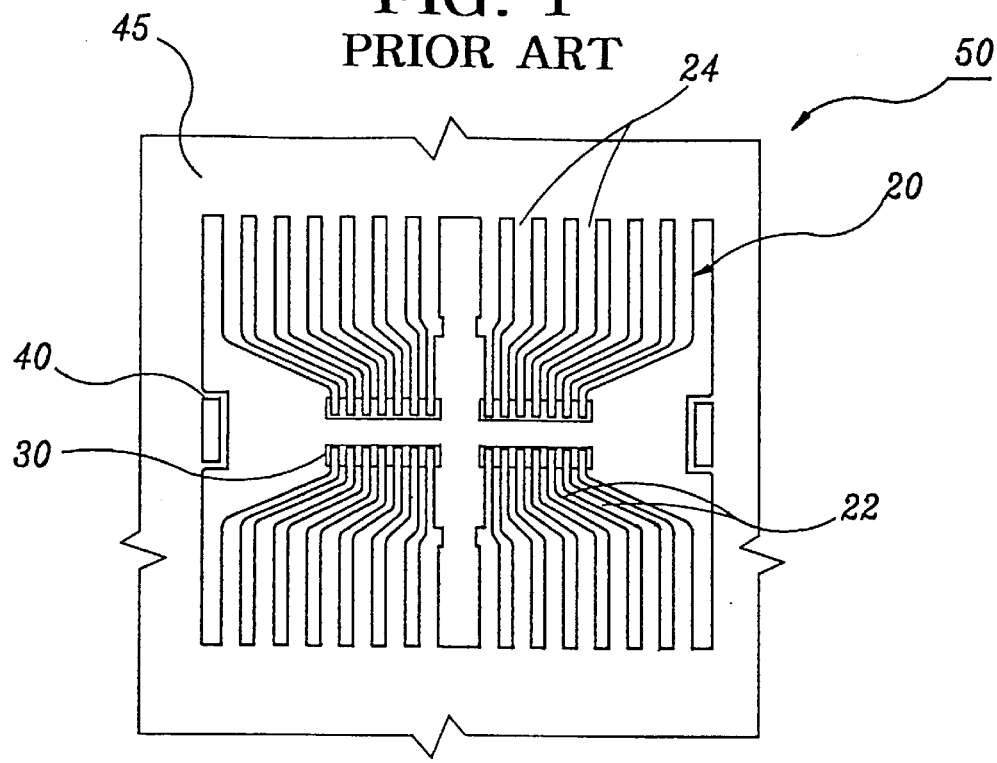
FIG. 1 is a plan view of a conventional lead frame.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
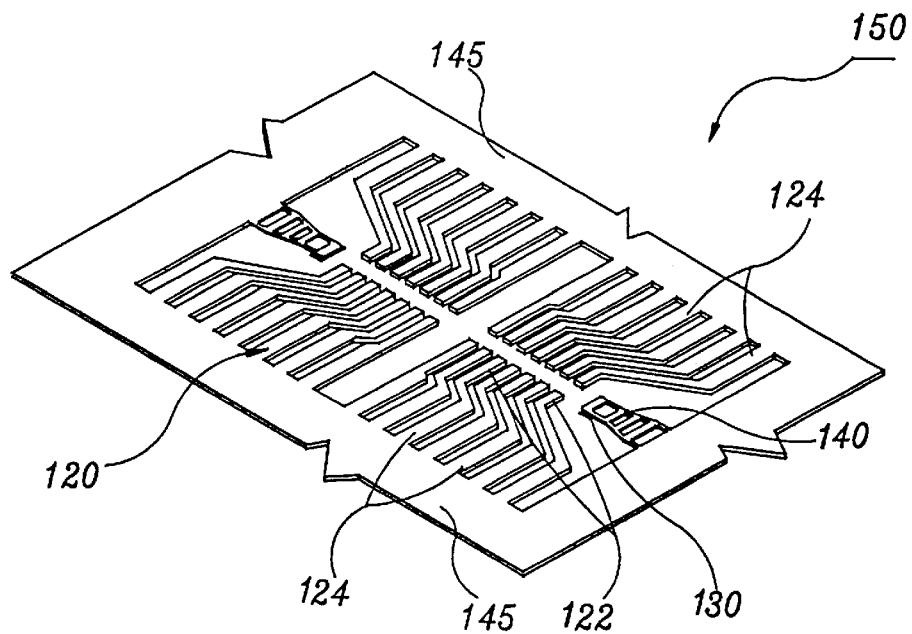
FIG. 5 is a perspective view showing a lead frame with extended tie-bar according to the present invention.

FIG. 5 is a perspective view showing a lead frame with extended tie-bars according to the present invention. With reference to FIG. 5, lead frame (150) includes a plurality of leads (120), each being disposed with a certain pitch, and also includes tie-bars (140) formed at opposing end sides. Leads (120) comprise inner leads (122) which will be electrically connected to bonding pads of a chip, and outer leads (124) which will extend outside the package body after encapsulation, and which are integrated with inner leads (122). The ends of outer leads (124) are integrated with side rails (145), which are formed along the opposing sides of lead frame (150) in its length direction. Tie-bars (140) also are integrated with side rails (145). Side rails (145) support the leads (120) and tie-bars (140), and contact a transfer rail when lead frame (150) moves using the transfer rail.

Tie-bars (140) are attached to one surface of a double-sided adhesive polyimide tape (130) at its bottom surface. The other side of the tape (130) will be bonded to the chip so that tie-bars (140) can be attached to chip through the tape (130).

The part of inner leads (122), which will be electrically connected to bonding pads on chip, is down-set, unlike conventional lead frame (50) shown in FIG. 1. By "down set", it is meant that the ends of the inner leads extend outside the plane defined by the side rails and tie-bars. Down-set of inner leads (122) will be described hereinafter.

Since the lead frame (150) preferably has no polyimide tape attached to the bottom surface of its inner leads (122), it can be designed to have different pitches between inner leads (122), unlike a conventional lead frame (50) which should have identical pitch. Therefore, coupling effects produced by inner leads which have identical pitch to avoid adhesion failure of the tape (30), are reduced. Tie-bars (140) may be formed at two opposing ends of every unit of the lead frame in the width or length direction, or in both directions.

Figure 6:
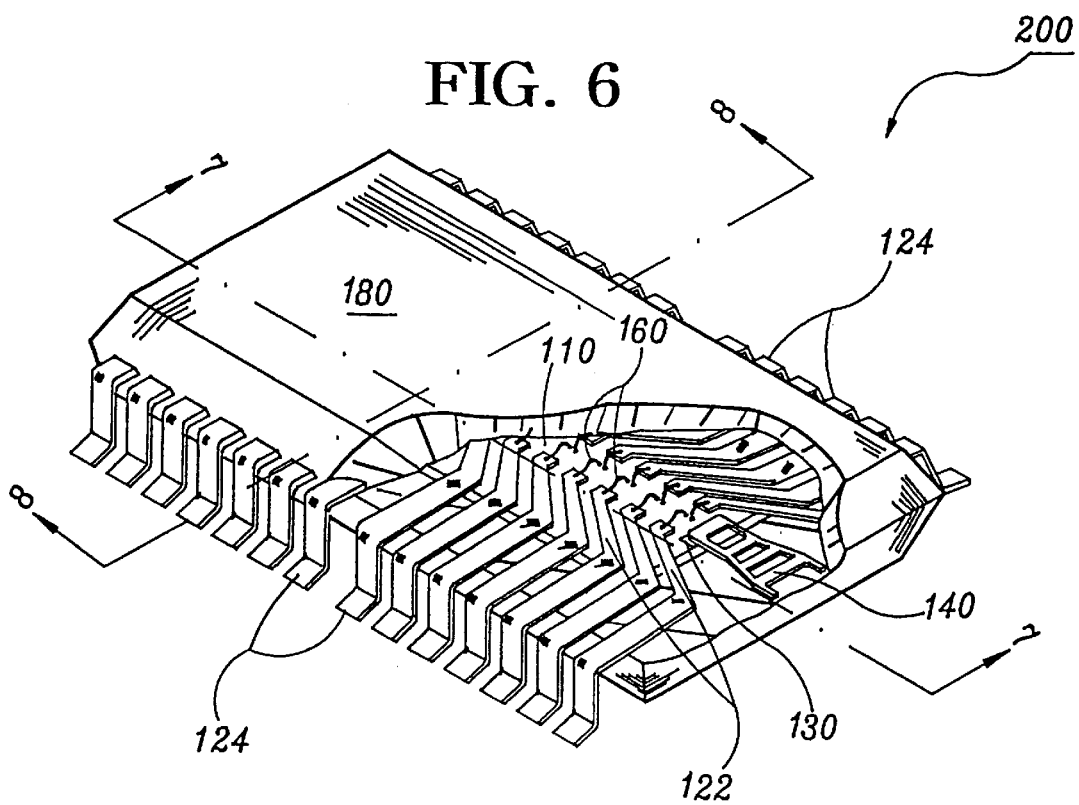
FIG. 6 is a cut-away perspective view of a semiconductor chip package employing the lead frame of FIG. 5.
Figure 7:
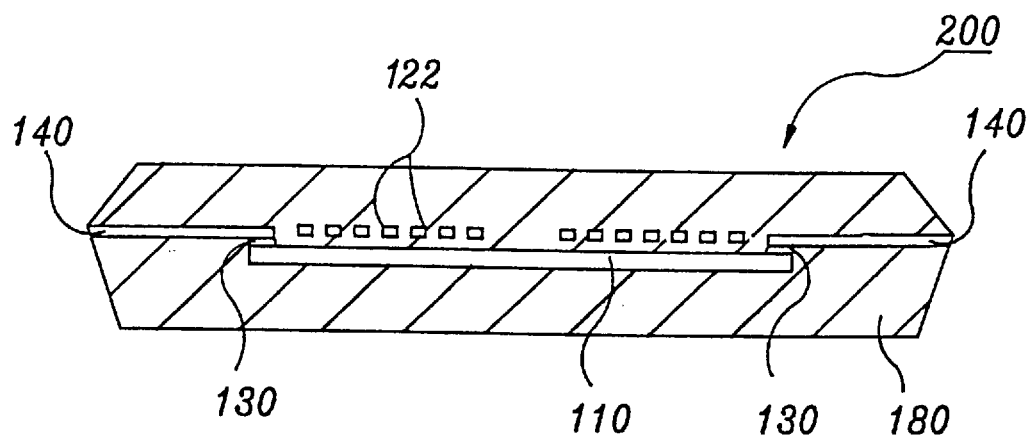
FIG. 7 is a cross-sectional view taken along the line "7—7" in FIG. 6.
Figure 8:
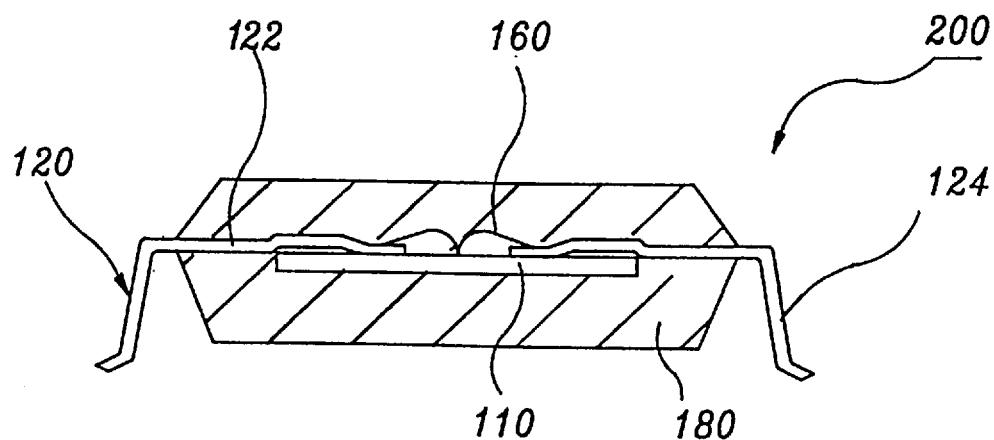
FIG. 8 is a cross-sectional view taken along the line "8—8" in FIG. 6.

FIG. 6 is a cut-away perspective view of a semiconductor chip package employing the lead frame of FIG. 5. FIGS. 7 and 8 are cross-sectional views taken along the lines "7—7" and "8—8" in FIG. 6. With reference to FIGS. 6–8, LOC type package (200) includes tie-bars (140) which are attached to an upper surface of chip at their ends where double-sided adhesive polyimide tape (130) is bonded. The tape (130) is bonded to the area of chip (110) where bonding pads are not formed. A row of bonding pads (not shown) is formed at the center of the chip, and the bonding pads are electrically connected to respective corresponding inner leads (122) through bonding wires (160).

The package body (180) is made of molding resin encapsulant which protects the chip (110), inner leads (122), bonding wires (160), and tie-bars (140) from the external environment. The outer leads (124) extend from the package body (180) and are integrated with corresponding inner leads (122) as described in connection with FIG. 5. The outer leads are configured for the electronic apparatus on which the package will be mounted. The LOC type package (200) is generally a surface mount package.

Lead frame (150) of the present invention includes tie-bars (140) which are attached to chip (110), while inner leads (122) are not attached to chip (110). Since the lead frame (150) has no double-sided adhesive tape for contacting the inner leads to the chip, a mechanism for contacting the inner leads to the chip may be required. For this purpose, inner leads (122) are down-set to extend adjacent or contact an upper surface of chip. In other words, the inner leads are not coplaner with the remainder of the lead frame.

If inner leads (122) are not down-set, they may be too far from the chip to produce successful electrical connection using bonding wires (160) between the inner leads (122) and the bonding pads of the chip (110). For electrical connection between the inner leads (122) and the bonding pads, one end of bonding wires (160) is generally ball-bonded to a bonding pad of chip (110) and the other end of bonding wires (160) is then generally stitch-bonded to an upper surface of inner leads (122). If the distance between the bonding pads and the inner leads is excessive, excessive pressure may be applied to the inner leads during the stitch bonding, resulting in downward movement of the inner leads. After completion of stitch-bonding, the inner leads generally restore to their original position. This may stress the bonding wire (160) connected thereto, resulting in a wire hill crack at the bonding site where the bonding wire is stitch-bonded to the inner lead. This eventually may reduce the reliability of the package. Accordingly, for lead frames of the present invention, the inner leads are preferably down-set so that they are as close to the chip as possible.

Figure 2:
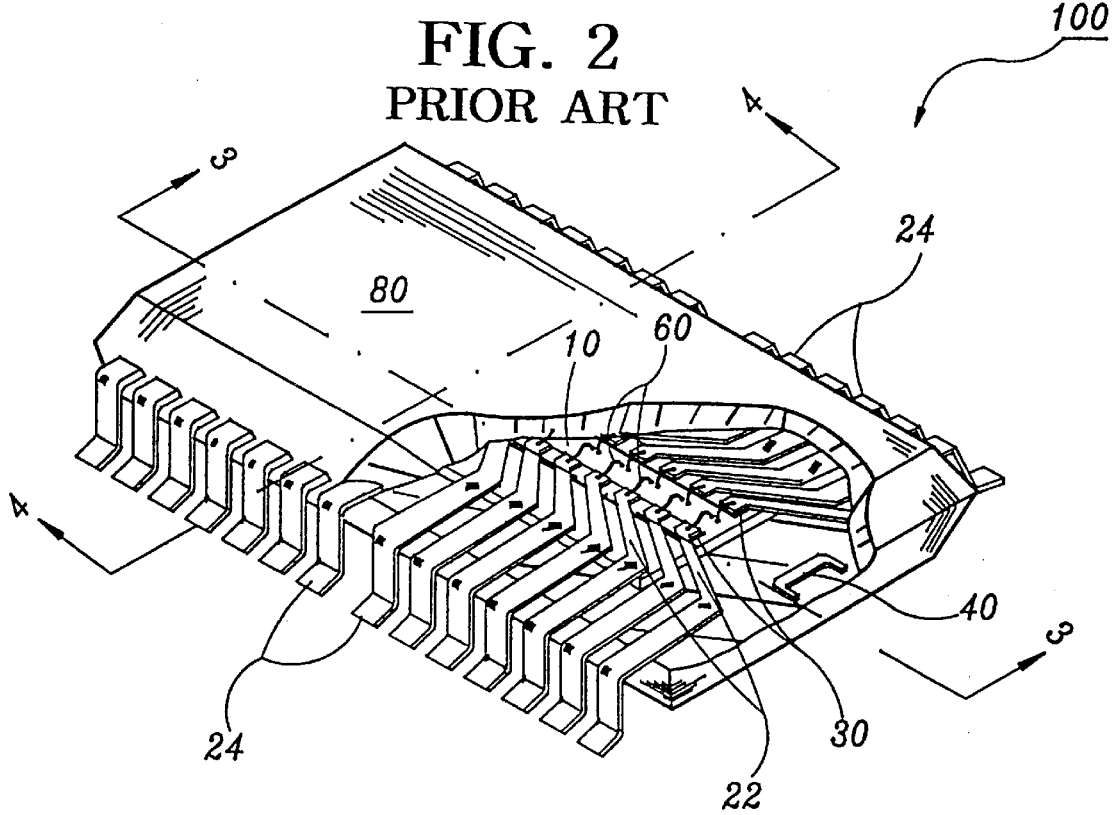
FIG. 2 is a cut-away perspective view of a semiconductor chip package employing the lead frame of FIG. 1.
Figure 3:
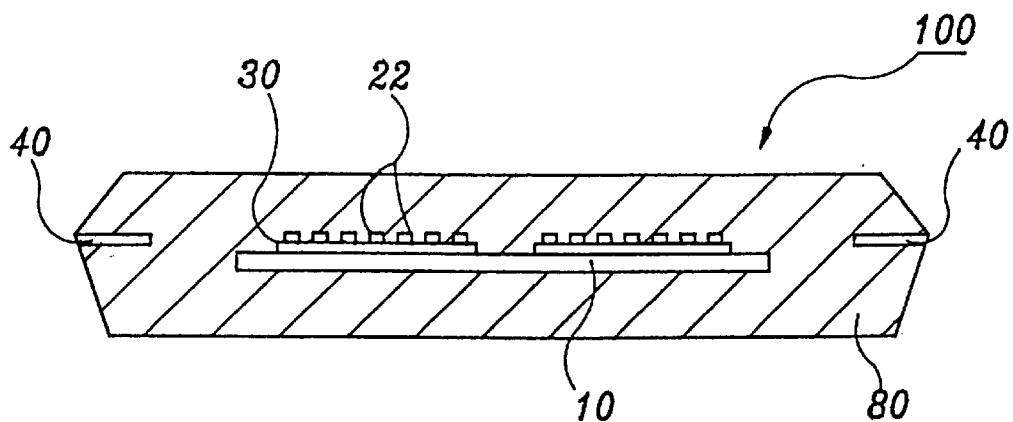
FIG. 3 is a cross-sectional view taken along the line "3—3" in FIG. 2.
Figure 4:
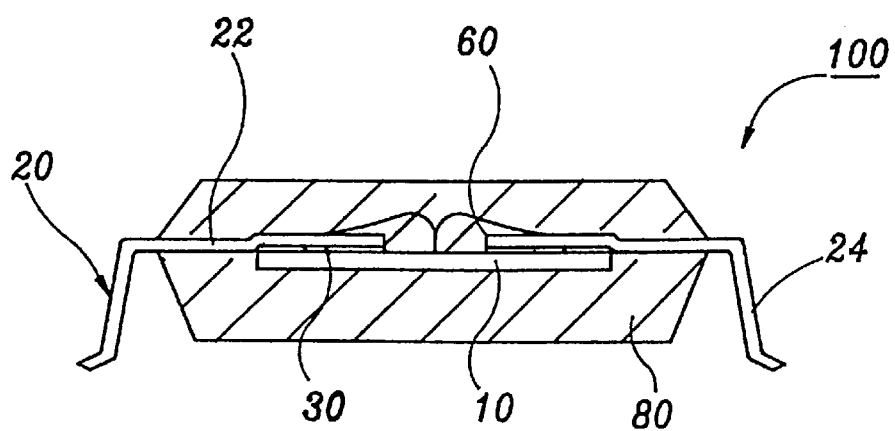
FIG. 4 is a cross-sectional view taken along the line "4—4" in FIG. 2.

Tie-bars (140) of the lead frame (150) according to the present invention extend toward the center of the lead frame (150), where they are adhesively attached to an upper surface of chip (110) at their ends. A double-sided adhesive tape (130) is bonded to the extended end of the tie-bars (140). The area of tie-bars (140) attached to the chip is selected so as to support the load of the chip (110) and to assure reliability of the package (200). Further, the area should preferably be as small as possible, to reduce absorption of moisture which may cause delamination of the tape (130) from the chip (110). The area attached to the tape is generally far smaller for packages (200) according to the present invention than for that of the conventional package (100) shown in FIG. 2.

Figure 9:
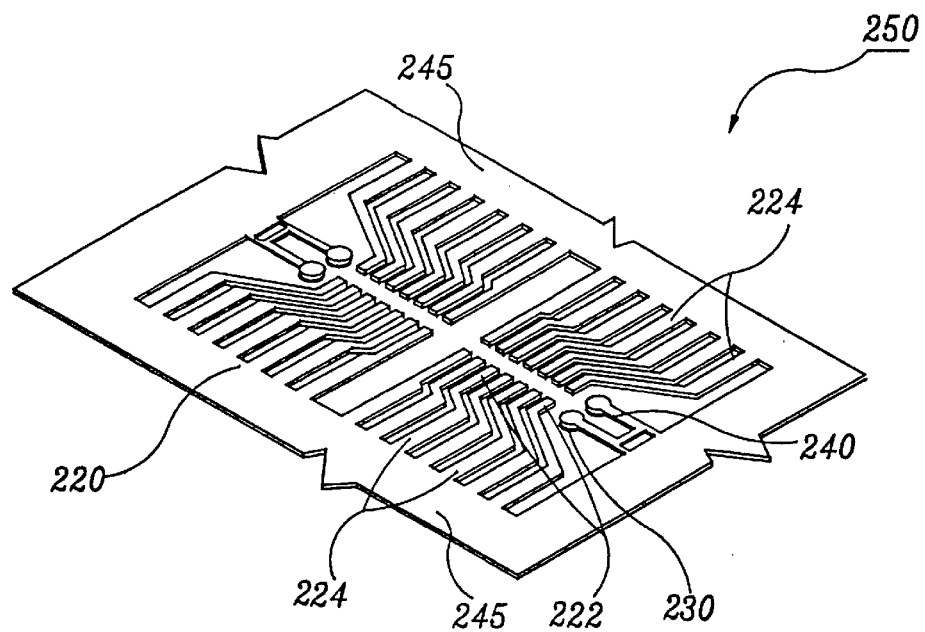
FIG. 9 is a perspective view showing another embodiment of lead frame with extended tie-bar according to the present invention.
Figure 10:
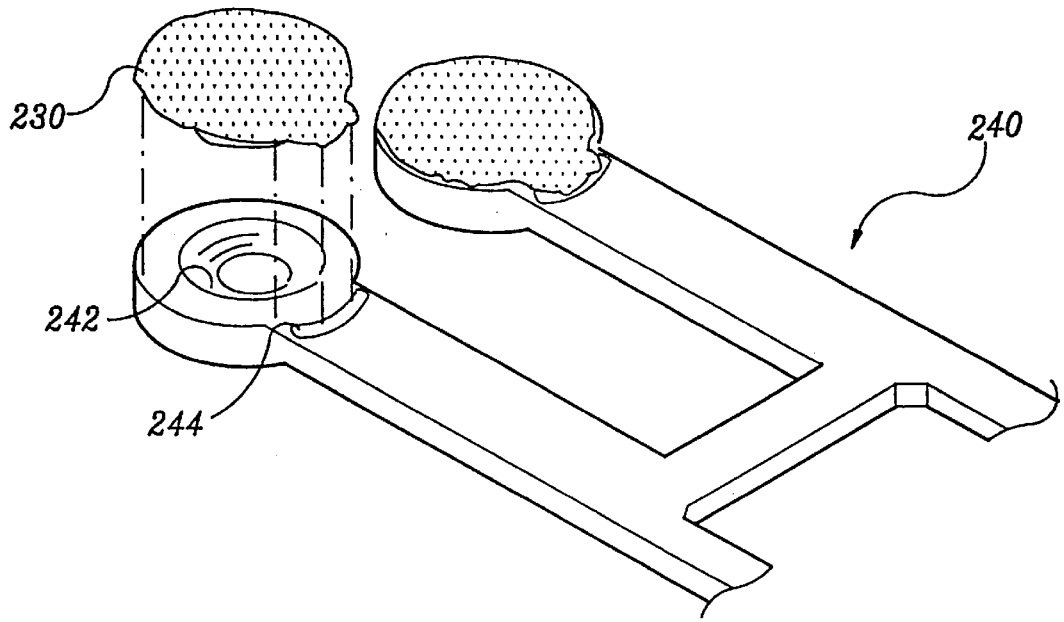
FIG. 10 is a perspective view from the bottom of a tie-bar shown in FIG. 9.

FIG. 9 is a perspective view showing another embodiment of a lead frame with extended tie-bars according to the present invention. FIG. 10 is a perspective view from the bottom of the tie-bars shown in FIG. 9.

With reference to FIGS. 9 and 10, lead frame (250) has a plurality of leads (220), each being disposed with a certain pitch, and includes tie-bars (240) formed at opposing ends. Leads (220) include inner leads (222) which will be electrically connected to the bonding pads of the chip, and outer leads (224) which will extend outwardly from the package body after encapsulation. Outer leads (224) are integrated with inner leads (222). The ends of outer leads (224) are integrated with side rails (245) formed along the opposing sides of lead frame (250) in its length direction. Tie-bars (240) also are integrated with side rails (245). Side rails (245) support the leads (220) and tie-bars (240), and contact a transfer rail when lead frame (250) moves using the transfer rail.

Tie-bars (240) include, at a bottom surface of their extended end, a hollow cup (242) filled with a liquid adhesive (230). The liquid adhesive (230) is not fully cured and is preferably a gel ("B stage"). Tie-bars (240) also include a long groove (244) near the hollow cup (242) to prevent overflowing of liquid adhesive (230) from the hollow cup (242).

The ends of inner leads (222), which will be electrically connected to bonding pads on chip, are down-set, as were the inner leads shown FIG. 5. The tie-bars (240) may be formed at two opposing ends of every unit of the lead frame in the width or length direction, or both directions.

Figure 11:
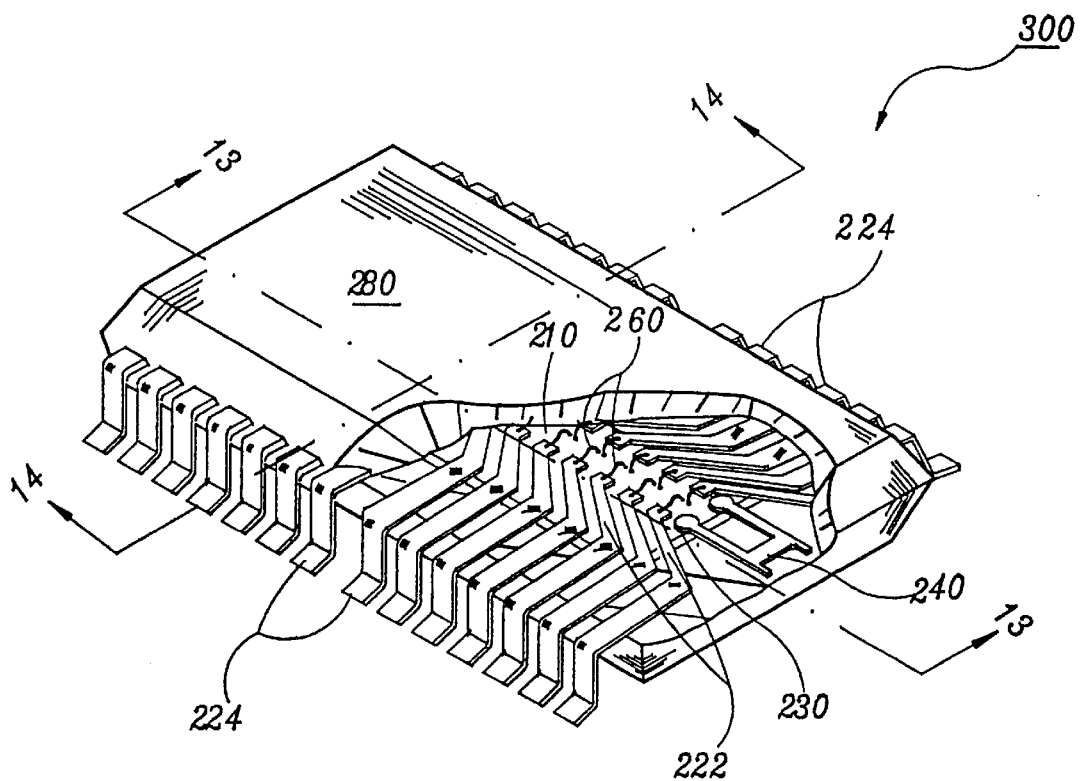
FIG. 11 is a cut-away perspective view of a semiconductor chip package employing the lead frame of FIG. 9.
Figure 12:
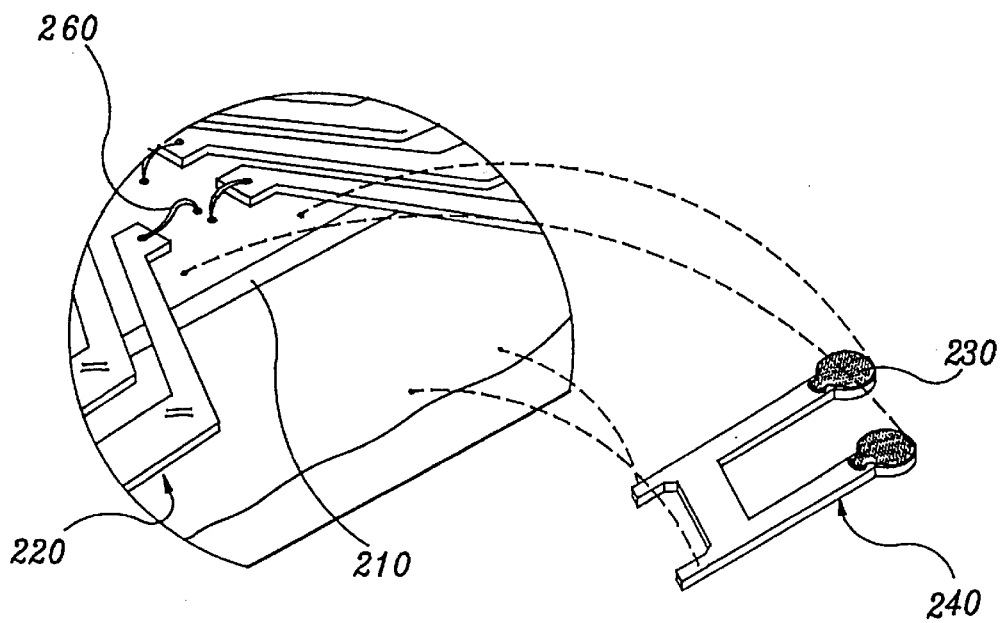
FIG. 12 is a perspective view showing the assembly of the chip shown in FIG. 11 and tie-bar.
Figure 13:
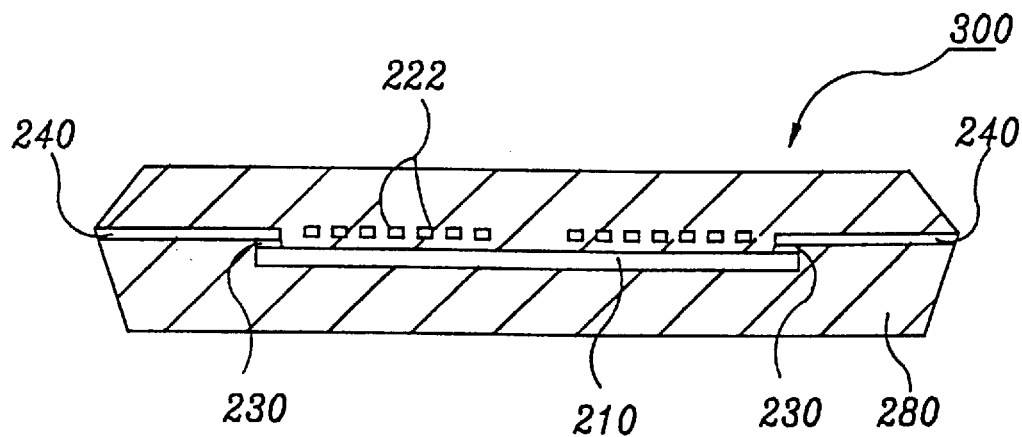
FIG. 13 is a cross-sectional view taken along the line "13—13" in FIG. 11.
Figure 14:
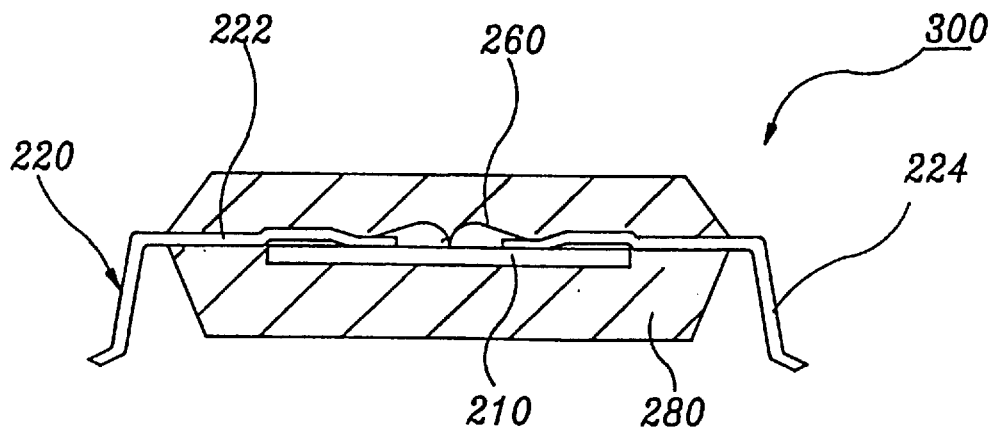
FIG. 14 is a cross-sectional view taken along the line "14—14" in FIG. 11.

FIG. 11 is a cut-away perspective view of semiconductor chip package employing the lead frame of FIG. 9. FIG. 12 is a perspective view showing the attachment of a tie-bar to a chip shown in FIG. 11. FIGS. 13 and 14 are cross-sectional views taken along the lines "13—13" and "14—14" in FIG. 11.

With reference to FIGS. 11 through 14, the LOC type package (300) tie-bars (240) are attached to an upper surface of the chip at their extended ends, using the liquid adhesive (230) filled in hollow cups (242) in the ends. The adhesive (230) is applied to the area of chip (210) where bonding pads are not formed. A row of bonding pads (not shown) is formed at the center of the chip (210), and bonding pads are electrically connected to respective corresponding inner leads (222) through bonding wires (260).

The package body (280) is made of a molding resin encapsulant which protects chip (210), inner leads (222), bonding wires (260), and tie-bars (240) from the external environment. The outer leads (224) extend from the package body (280), are integrated with corresponding inner leads (222) as described in connection with FIG. 9, and are adapted for the electronic apparatus to which the package will be mounted. The LOC type package (300) is generally a surface mount package.

Lead frames (250) of the present invention include tie-bars (240) which are adhesively attached to chip (210), while inner leads (122) are not adhesively attached to chip (210). Since the lead frame (250) has no double-sided adhesive tape for contacting inner leads to chip, a mechanism for contacting inner leads to chip may be required. For this purpose, inner leads (222) are down-set to extend adjacent or contact an upper surface of chip. The down-set forming of inner leads (222) is the same in its shape and object as described above with respect to FIGS. 5 through 8.

Tie-bars (240) of the lead frame (250) according to the present invention extend toward the center of the lead frame (250), where they are adhesively attached to an upper surface of chip (210) at their extended end, which includes a hollow cup (242) filled with a liquid adhesive (230). The area of attachment is selected to support the weight of the chip (210), and to assure reliability of the package (300). For this purpose, the adhesive should have sufficient bonding strength and the hollow should have sufficient size to provide such an attachment area.

The lead frame (250) may be advantageous because an expensive tape cutter is not required. Since the liquid adhesive (230) can be injected into hollow cups (242) by using an injector such as a syringe, a package may be produced at a lower cost.

The present invention provides at least the following advantages:

First, the area of the chip to be contacted with the absorptive adhesive tape may remain constant regardless of the increase in the chip size, and may be significantly reduced compared with the conventional package. It is thus possible to reduce or prevent delamination of the tape from the chip caused by moisture absorption of the tape.

Second, packages using lead frames in which the chip is attached to the tie-bars with a liquid adhesive may be produced at a lower cost, and may have a constant attachment area between the chip and tie-bars regardless of the chip size.

Finally, since the inner leads need not be equidistant, coupling effects can be reduced or prevented.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A lead frame for a semiconductor chip, comprising:
   a pair of spaced apart side rails;
   a plurality of leads extending from each of said spaced apart side rails towards the other of said spaced apart side rails, said leads including lead ends which extend adjacent a semiconductor chip placed adjacent thereto; and
   a pair of spaced apart tie-bars, each of which extends between said pair of spaced apart side rails to maintain said spaced apart side rails in spaced apart relation;
   each of said spaced apart tie-bars further extending towards one another sufficiently close to one another so as to overlie a semiconductor chip placed adjacent thereto;
   wherein each of said tie-bar extensions includes a tie-bar extension end which overlies a semiconductor chip placed adjacent thereto, each of said tie-bar ends including adhesive thereon; and
   wherein each of said tie-bar extension ends includes at least one cup, containing adhesive material therein.

2. A lead frame according to claim 1 wherein said adhesive material is a polyimide tape.

3. A lead frame according to claim 1 wherein said adhesive material is a liquid adhesive.

4. A lead frame according to claim 3 further comprising a groove in said tie-bar extension end, adjacent said cup, for containing excess liquid adhesive from said cup.

5. A lead frame according to claim 1 wherein said lead ends extend sufficiently close to one another so as to overlie the semiconductor chip placed adjacent thereto.

6. A semiconductor chip package, comprising:
   a semiconductor chip and a lead frame, said lead frame comprising:
   a pair of spaced apart side rails;
   a plurality of leads extending from each of said spaced apart side rails towards the other of said spaced apart side rails, said leads including lead ends which extend adjacent said semiconductor chip for electrical connection thereto; and
   a pair of spaced apart tie-bars, each of which extends between said pair of spaced apart side rails to maintain said spaced apart side rails in spaced apart relation;
   each of said spaced apart tie-bars further extending towards one another sufficiently close to one another so as to overlie said semiconductor chip and thereby mechanically support said semiconductor chip;
   wherein said spaced apart tie-bars each include a tie-bar extension, which extend toward one another so as to overlie said semiconductor chip;
   wherein each of said tie-bar extensions includes a tie-bar extension end which overlies said semiconductor chip, said semiconductor chip package further comprising adhesive between each of said tie-bar extension ends and said semiconductor chip; and
   wherein each of said tie-bar extension ends includes at least one cup, said semiconductor chip package further comprising adhesive material in said at least one cup, and contacting said semiconductor chip.

7. A semiconductor chip package according to claim 6 wherein said adhesive material is a polyimide tape.

8. A semiconductor chip package according to claim 6 wherein said adhesive material is a liquid adhesive.

9. A semiconductor chip package according to claim 8 further comprising a groove in said tie-bar end, adjacent said cup, for containing excess liquid adhesive from said cup.

10. A semiconductor chip package, comprising:
    a semiconductor chip;
    a plurality of leads extending away from said semiconductor chip, and which are electrically connected thereto;
    a pair of spaced apart tie-bars, each of which extends away from said semiconductor chip and is electrically unconnected thereto;

adhesive between each of said spaced apart tie-bars and said semiconductor chip, so as to adhesively connect said semiconductor chip to said tie-bars; and a package body which encapsulates said semiconductor chip and which partially encapsulates said leads, such that said leads extend from said package body;

wherein each of said tie-bars include at least one cup adjacent said semiconductor chip, and wherein said adhesive is located in said cups.

11. A semiconductor chip package according to claim 10 wherein said adhesive is a polyimide tape.

12. A semiconductor chip package according to claim 10 wherein said adhesive is a liquid adhesive.

13. A semiconductor chip package according to claim 10 further comprising a groove in said tie-bar, adjacent said cup, for containing excess liquid adhesive from said cup.

* * * * *